(12) United States Patent
Van Kampen et al.

(10) Patent No.: US 10,566,163 B2
(45) Date of Patent: Feb. 18, 2020

(54) MEMS RF-SWITCH WITH CONTROLLED CONTACT LANDING

(71) Applicant: CAVENDISH KINETICS, INC., San Jose, CA (US)

(72) Inventors: Robertus Petrus Van Kampen, S-Hertogenbosch (NL); Richard L. Knipe, McKinney, TX (US); Mickael Renault, San Jose, CA (US); Shibajyoti Ghosh Dastider, Rocklin, CA (US); Jacques Marcel Muyango, Rocklin, CA (US)

(73) Assignee: CAVENDISH KINETICS, INC., San Jose, CA (US)

( * ) Notice: Subject to any disclaimer, the term of this patent is extended or adjusted under 35 U.S.C. 154(b) by 19 days.

(21) Appl. No.: 15/770,705

(22) PCT Filed: Nov. 15, 2016

(86) PCT No.: PCT/US2016/061938
§ 371 (c)(1),
(2) Date: Apr. 24, 2018

(87) PCT Pub. No.: WO2017/087342
PCT Pub. Date: May 26, 2017

(65) Prior Publication Data
US 2018/0315571 A1 Nov. 1, 2018

Related U.S. Application Data

(60) Provisional application No. 62/256,001, filed on Nov. 16, 2015.

(51) Int. Cl.
*H01H 59/00* (2006.01)
*B81B 3/00* (2006.01)
*H01G 5/16* (2006.01)

(52) U.S. Cl.
CPC ......... *H01H 59/0009* (2013.01); *B81B 3/001* (2013.01); *B81B 3/0035* (2013.01);
(Continued)

(58) Field of Classification Search
CPC .................................................. H01H 59/0009
See application file for complete search history.

(56) References Cited

U.S. PATENT DOCUMENTS

| | | | |
|---|---|---|---|
| 2005/0183938 A1* | 8/2005 | Chou | B81C 1/00611 200/181 |
| 2014/0300249 A1 | 10/2014 | Van Kampen et al. | |
| 2015/0116893 A1 | 4/2015 | Hanihara | |

FOREIGN PATENT DOCUMENTS

| | | |
|---|---|---|
| CN | 103889887 A | 6/2014 |
| JP | 2011-011325 A | 1/2011 |

(Continued)

OTHER PUBLICATIONS

International Search Report and Written Opinion dated Feb. 8, 2017, in corresponding application No. PCT/US2016/061938.
(Continued)

*Primary Examiner* — Daniel J Cavallari
(74) *Attorney, Agent, or Firm* — Patterson + Sheridan, LLP; Steven H. VerSteeg

(57) ABSTRACT

A MEMS switch contains an RF electrode 102, pull-down electrodes 104 and anchor electrodes 108 located on a substrate 101. A plurality of islands 226 are provided in the pull-down electrode and electrically isolated therefrom. On top of the RF electrode is the RF contact 206 to which the MEMS-bridge 212, 214 forms an ohmic contact in the pulled-down state. The pull-down electrodes 104 are covered with a dielectric layer 202 to avoid a short-circuit between the bridge and the pull-down electrode. Contact stoppers 224 are disposed on the dielectric layer 202 at locations corresponding to the islands 226, and the resulting
(Continued)

gap between the bridge and the dielectric layer in the pulled-down state reduces dielectric charging. In alternative embodiments, the contact stoppers are provide within the dielectric layer 202 or disposed on the islands themselves and under the dielectric layer. The switch provides good controllability of the contact resistance of MEMS switches over a wide voltage operating range.

21 Claims, 13 Drawing Sheets

(52) U.S. Cl.
CPC .......... *H01G 5/16* (2013.01); *B81B 2201/016* (2013.01); *H01H 2059/0018* (2013.01); *H01H 2059/0072* (2013.01)

(56) References Cited

FOREIGN PATENT DOCUMENTS

| | | |
|---|---|---|
| WO | 2014165624 A1 | 10/2014 |
| WO | 2015017743 A1 | 2/2015 |

OTHER PUBLICATIONS

Search report issued in corresponding Chinese Patent application No. 2016800659798, dated Feb. 17, 2019 (2 pages).
Office Action issued in corresponding Chinese Patent Application No. 201680065979.8, dated Feb. 28, 2019 (17 pages).
Office Action issued in corrsponding Chinese Patent Application No. 201680065979.8, dated Oct. 18, 2019 (13 pages).

\* cited by examiner

MEMS RF-SWITCH WITH CONTROLLED CONTACT LANDING

BACKGROUND OF THE DISCLOSURE

Field of the Disclosure

Embodiments of the present disclosure generally relate to a technique for obtaining a good controllability of the contact resistance of MEMS switches over a wide voltage operating range.

Description of the Related Art

A MEMS resistive switch contains a movable plate that moves by applying a voltage to an actuation electrode. Once the electrode voltage reaches a certain voltage, oftentimes referred to as a snap-in voltage, the plate moves towards the electrode. The plate moves back to the original position once the voltage is lowered to a release voltage. The release voltage is typically lower than the snap-in voltage due to the higher electrostatic forces when the plate is close to the actuation electrode and due to stiction between the plate and the surface to which the plate is in contact once moved closer to the electrode. The spring constant of the MEMS device sets the value of the pull in voltage and pull off voltage.

When the plate is actuated down, it lands on a contact electrode to which the plate makes an ohmic contact. To get a good ohmic contact resistance this typically means that the MEMS plate is pulled intimate with the contact-electrode with a high enough voltage applied to the pull-down electrode. This voltage can cause the plate to secondary land on the dielectric layer located above the pull-down electrode which is a reliability concern for device operation. It can lead to charging of the dielectric layer and a shift in the actuation voltage.

Due to process variations, the actuation voltage of the MEMS device can vary from wafer to wafer and lot to lot. This means to obtain a high yield, the actual operating voltage must be above the maximum expected variation in the MEMS actuation voltage. Devices that actuate at lower voltages would then see more voltage overdrive compared to devices that actuate at higher voltages. This can cause large variations in contact-force between the MEMS device and the contact-electrode which can cause a variation in contact resistance which is undesired.

Therefore, there is a need in the art for a MEMS switch that can have a large operating window while still have a controlled contact force and corresponding contact resistance.

SUMMARY OF THE DISCLOSURE

The present disclosure generally relates to a controlled MEMS device landing which results in a reliable repeatable contact resistance which can operate in a large operating voltage window.

In one embodiment, a MEMS device comprises a substrate having at least an anchor electrode, an RF electrode and a pull-down electrode disposed therein, wherein the pull-down electrode has a plurality of islands disposed therein; a switching element disposed over the substrate, the switching element electrically coupled to the anchor electrode and movable from a first position spaced a first distance from the RF electrode and a second position spaced a second distance from the RF electrode, wherein the second distance is less than the first distance; a dielectric layer disposed over the pull-down electrode; and contact stoppers disposed on the dielectric layer at locations corresponding to the islands.

In another embodiment, a MEMS device comprises a substrate having at least an anchor electrode, an RF electrode and a pull-down electrode disposed therein, wherein the pull-down electrode has a plurality of islands disposed therein; a switching element disposed over the substrate, the switching element electrically coupled to the anchor electrode and movable from a first position spaced a first distance from the RF electrode and a second position spaced a second distance from the RF electrode, wherein the second distance is less than the first distance; contact stoppers disposed on the islands; and a dielectric layer disposed over the substrate, contact stoppers and pull-down electrode.

In another embodiment, a MEMS device comprises a substrate having at least an anchor electrode, an RF electrode and a pull-down electrode disposed therein, wherein the pull-down electrode has a plurality of islands disposed therein; a switching element disposed over the substrate, the switching element electrically coupled to the anchor electrode and movable from a first position spaced a first distance from the RF electrode and a second position spaced a second distance from the RF electrode, wherein the second distance is less than the first distance; a dielectric layer disposed over the pull-down electrode; and contact stoppers disposed within the dielectric layer at locations corresponding to the islands.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to a controlled MEMS device landing which results in a reliable repeatable contact resistance which can operate in a large operating voltage window.

Figure 1A:
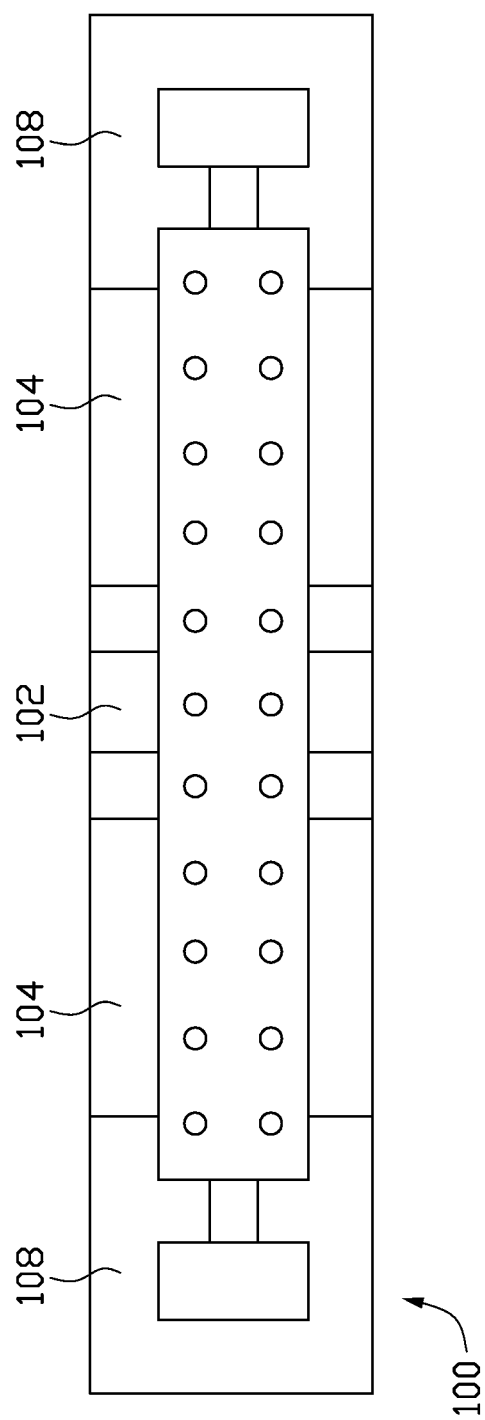
FIG. 1A is a schematic top-view of an ohmic MEMS switch.

FIG. 1A is a schematic top-view of an ohmic MEMS switch 100. It contains an RF-electrode 102, pull-down electrodes 104 and anchor electrodes 108. When a sufficiently high voltage is applied to the pull-down electrodes 104, the MEMS switch is actuated down and forms an ohmic connection between the RF-electrode 102 and anchor electrodes 108

Figure 1B:
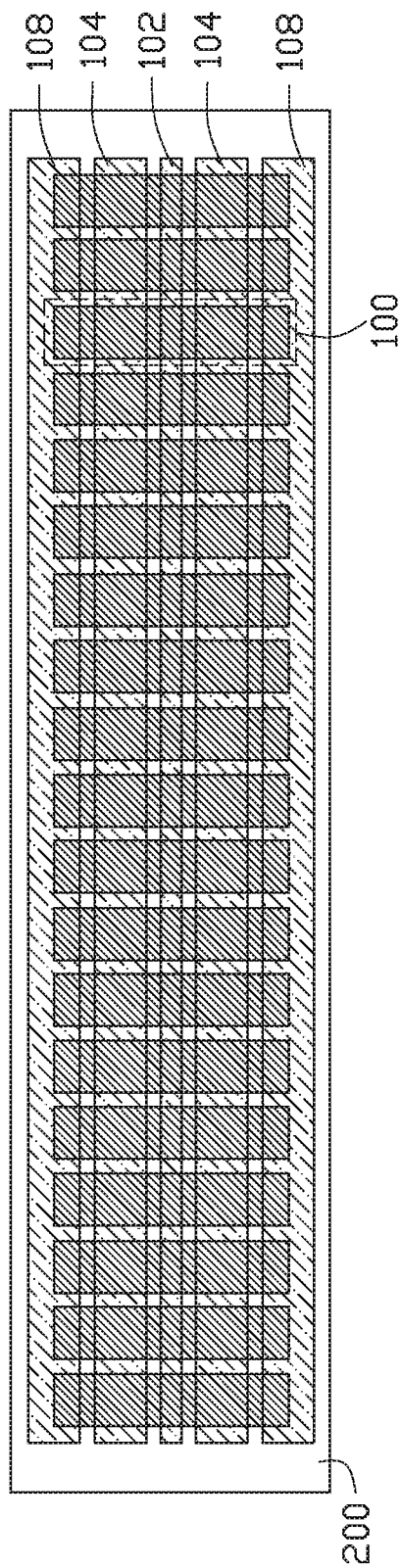
FIG. 1B is a schematic top view of an ohmic switch cell containing a number of parallel operated MEMS switches.

FIG. 1B is a schematic top view of an ohmic switch cell 200 containing a number of MEMS switches 100. All MEMS switches 100 in the cell are turned on at the same time by applying a high-enough voltage on the pulldown-electrodes 104. Because many switches are operated in parallel, the resistance between the RF-electrode 102 and anchor electrodes 108 is reduced.

Figure 1C:
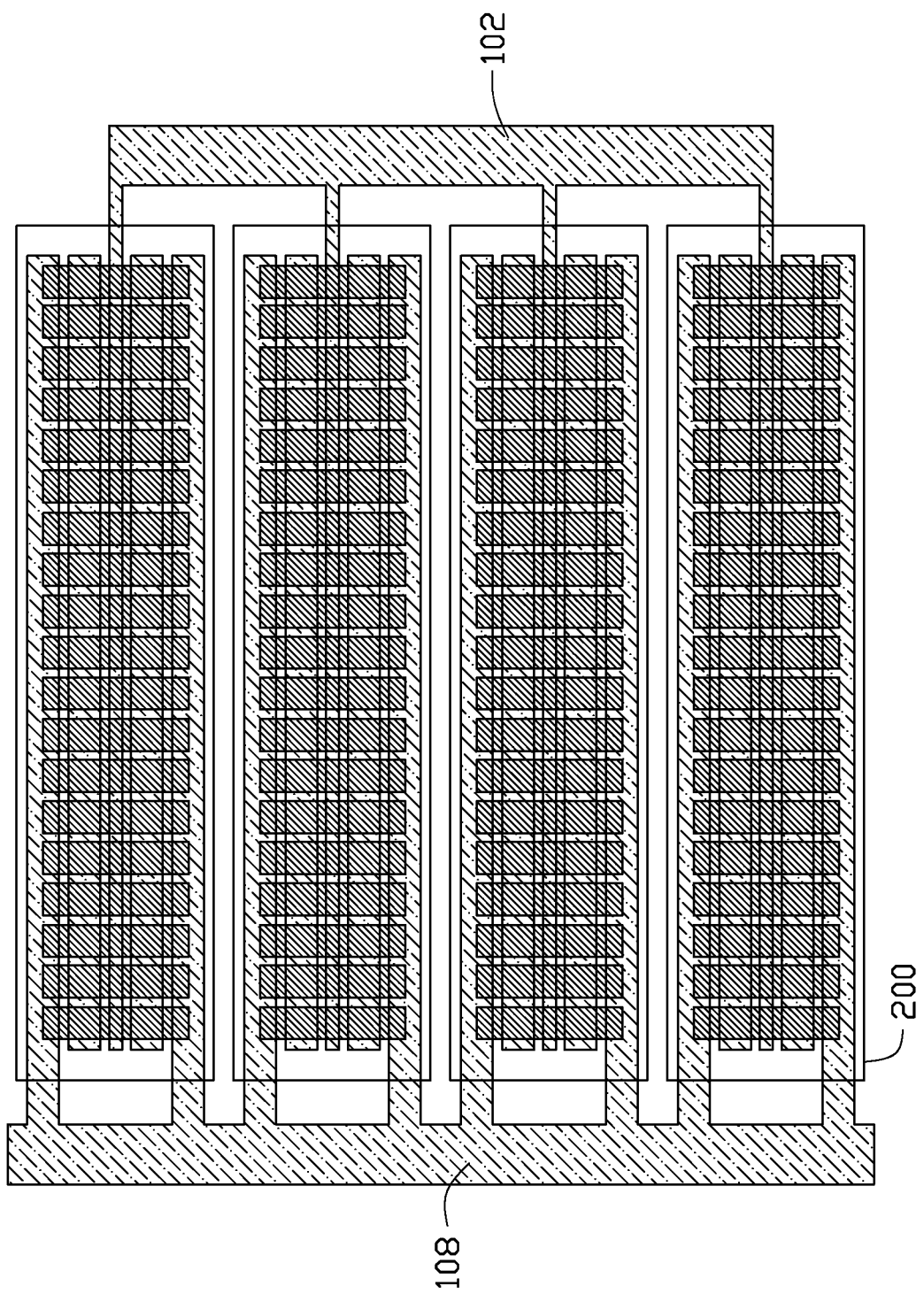
FIG. 1C is a schematic top view of an ohmic switch array containing a number of parallel operated switch-cells.

FIG. 1C shows a schematic top-view of an ohmic switch-array. It contains a number of parallel operated switch-cells 200. The RF-electrodes 102 of each cell are connected together at one end of each switch-cell 200, while the anchor-electrodes 108 are connected together at the other end of each switch-cell 200. When all cells are turned on this results in a further reduction of the resistance between the RF-electrode 102 and anchor electrode 108. At the same time, because many switches are operated in parallel the total switch-array can handle more current.

Figure 2A:
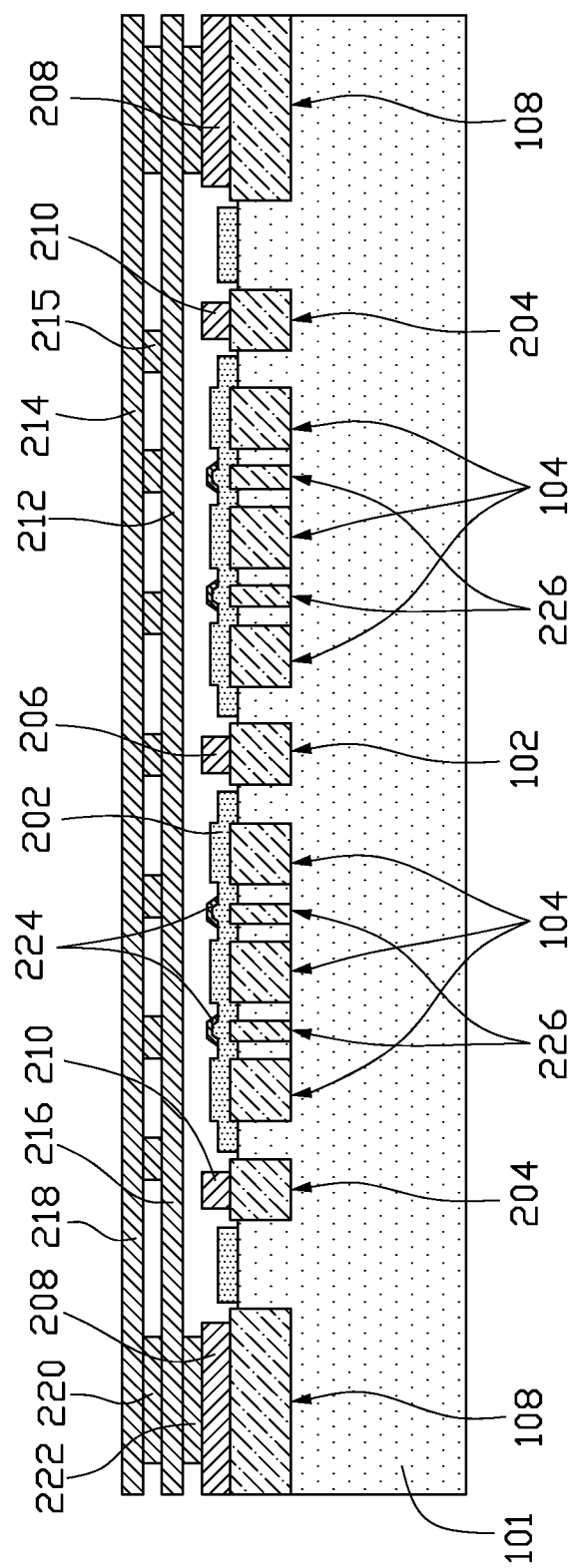
FIG. 2A is a schematic cross-sectional view of an ohmic MEMS switch according to one embodiment.

FIG. 2A shows a cross-section view of an ohmic MEMS switch according to an embodiment. This disclosure describes a method of generating a controlled landing force on the contact while allowing a large operating voltage window.

The MEMS switch contains an RF electrode 102, pull-down electrodes 104 and anchor electrodes 108 located on substrate 101. The pull-down electrodes are covered with a dielectric layer 202 to avoid a short-circuit between the MEMS switch and the pull-down electrode in the pulled-down state. Suitable materials for the electrically insulating layer 202 include silicon based materials including silicon-oxide, silicon-dioxide, silicon-nitride and silicon-oxynitride. The thickness of this layer 202 is typically in the range of 50 nm to 150 nm to limit the electric field in the dielectric layer. Additionally the device contains additional plate-landing electrode 204 which can be unconnected (as shown) or connected to the anchor electrode 108. On top of the RF electrode 102 is the RF contact 206 to which the switch body forms an ohmic contact in the pulled-down state. On top of the anchor-electrode 108 is the anchor contact 208 to which the MEMS device is anchored. On top of the plate-landing electrode 106 is the plate-landing contact 210. Typical materials used for the contacts 206, 208, 210 include Ti, TiN, TiAl, TiAlN, AlN, Al, W, Pt, Ir, Rh, Ru, $RuO_2$, ITO and Mo and combinations thereof.

The switch element contains a stiff bridge consisting of conductive layers 212, 214 which are joined together using an array of vias 216. This allows for a stiff plate-section and compliant legs to provide a high contact-force while keeping the operating voltage to acceptable levels. The MEMS bridge is suspended by legs 216 formed in the lower layer 212 and legs 218 formed in the upper layer 214 of the MEMS bridge. The upper layer 214 of the MEMS bridge is anchored to the lower layer 212 of the MEMS in the anchor with via 220. The lower layer of the MEMS bridge is anchored to the anchor contact 208 with via 222. Current that is injected from the RF contact 206 into the MEMS bridge when the MEMS switch is actuated down flows out through the MEMS-bridge and legs 216, 218 in both directions to the anchor electrodes 108 located on either side of the switch-body. Because these legs are not joined together with vias 216 like in the MEMS-bridge the compliance of these legs is still low enough to allow for reasonable operating voltages to pull the MEMS bridge 212, 214 in contact with the RF contact 206 and plate-landing contacts 210.

Additional contact stoppers 224 are located above little islands 226 which are surrounded by the pull-down electrodes 104. When a high enough voltage is applied to the pull-down electrodes, the MEMS bridge deflects until it stops on these contact stoppers 224. The contact stoppers 224 are spaced close enough that the voltage on the pull-down electrode can be increased by a large amount without causing a substantial increase in MEMS plate displacement. The little islands 226 are electrically isolated from the pull-down electrode 104 which reduces the electric field in the contact areas 224 where they touch the MEMS-bridge.

Figure 2B:
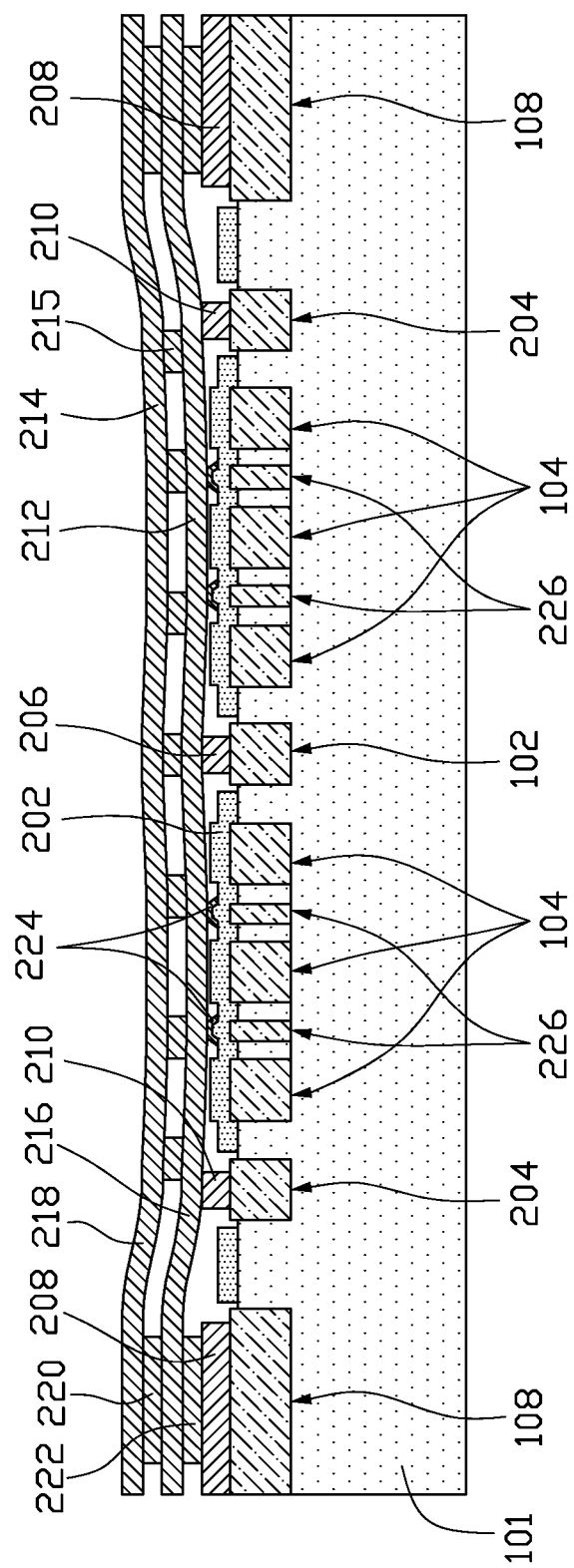
FIG. 2B is a schematic cross-sectional view of an ohmic MEMS switch according to one embodiment which is actuated down.

FIG. 2B shows the ohmic MEMS device in the actuated down state. The MEMS bridge rests on the RF-contact 206, plate-stopper contact 210 and additional contact stoppers 224. The height of the contacts 206, 210 is greater than the height of the additional contact stoppers 224. This causes the MEMS bridge to flex around the RF-contact 206 which creates a large contact force. This is required for a good ohmic contact.

By controlling the height difference between the contacts 206, 210 and the additional contact stoppers 224 the contact force (and thus also the contact resistance) can be controlled. A further increase in applied voltage will not substantially increase the contact force on the RF-contact 206 and thus a stable contact resistance can be obtained for a wide operating voltage range. Furthermore by controlling the height of the additional contact stoppers 224, the remaining gap between the MEMS bridge and the dielectric above the pull-down electrode 104 can be controlled which can reduce the chance of dielectric charging.

Since all required heights are referring to the same reference surface (the top of 102, 226, 204) a stable processing window can be obtained. The contact force is set by the thickness of the contacts 206, 210 and by the thickness of the additional stoppers 224 and dielectric 202. Since all these thicknesses are controlled by deposition, a good control of the contact force can be obtained.

Figure 2C:
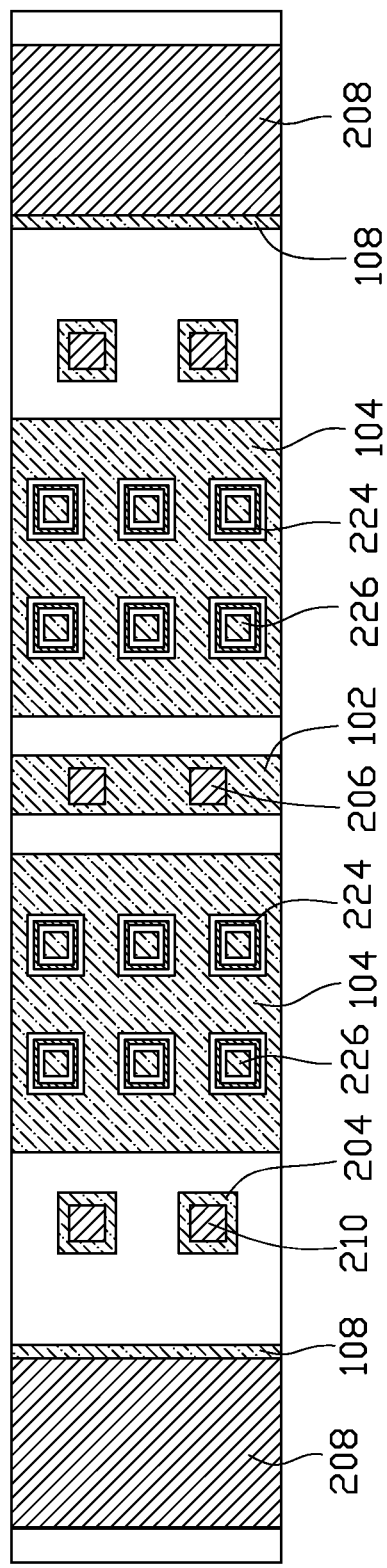
FIG. 2C is a schematic top view of the bottom landing surfaces of an ohmic MEMS according to one embodiment.

FIG. 2C shows a schematic top-view of the bottom controlled landing surface of the MEMS-switch. It shows the additional contact stoppers 224 above the isolated islands 226 which are surrounded by the pull-down electrodes 104. Because of the close-spacing between these additional stoppers 224, the MEMS plate cannot be pulled down any further once landed on these stoppers. This ensures that the dielectric surface above the pull-down electrode does not see a very high electric field which prevents dielectric charging which causes a shift in the actuation voltage.

Figure 3A:
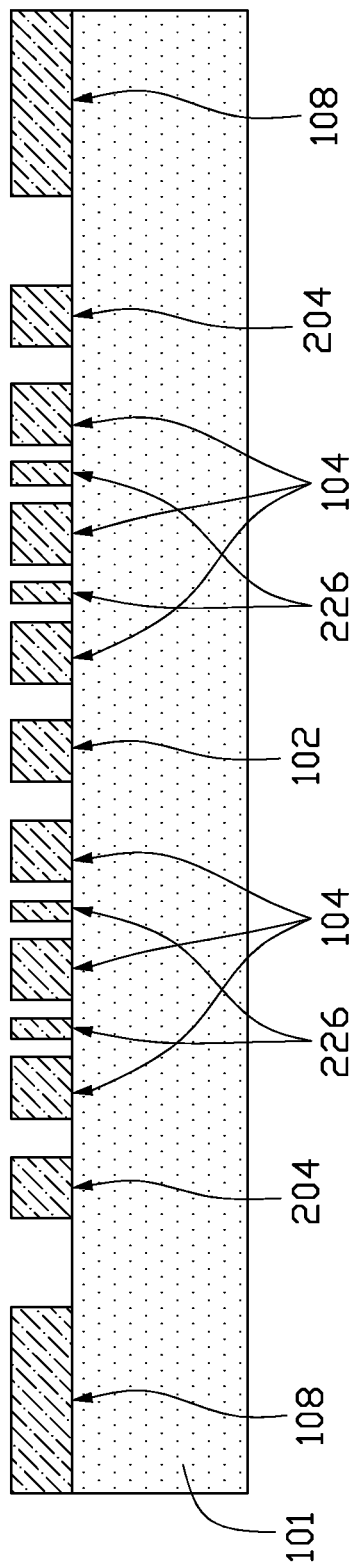
FIGS. 3A-3G are schematic illustrations of a MEMS ohmic switch at various stages of fabrication according to one embodiment.

FIGS. 3A-3F are schematic illustrations of the bottom controlled landing surfaces of the MEMS ohmic switch at various stages of fabrication according to one embodiment. FIG. 3A shows the backplane starting material of the MEMS-switch and contains a substrate 101 with a plurality of electrodes including the RF electrode 102, pull-down electrodes 104, isolated islands 226, plate-landing electrode 204 and the anchor electrodes 108. It is to be understood that the substrate 101 may comprise a single layer substrate or a multi-layer substrate such as a CMOS substrate having one or more layers of interconnects. Additionally, suitable materials that may be used for these electrodes 102, 104, 226, 204, 108 include titanium-nitride, aluminum, tungsten, copper, titanium, and combinations thereof including multi-layer stacks of different material.

Figure 3B:
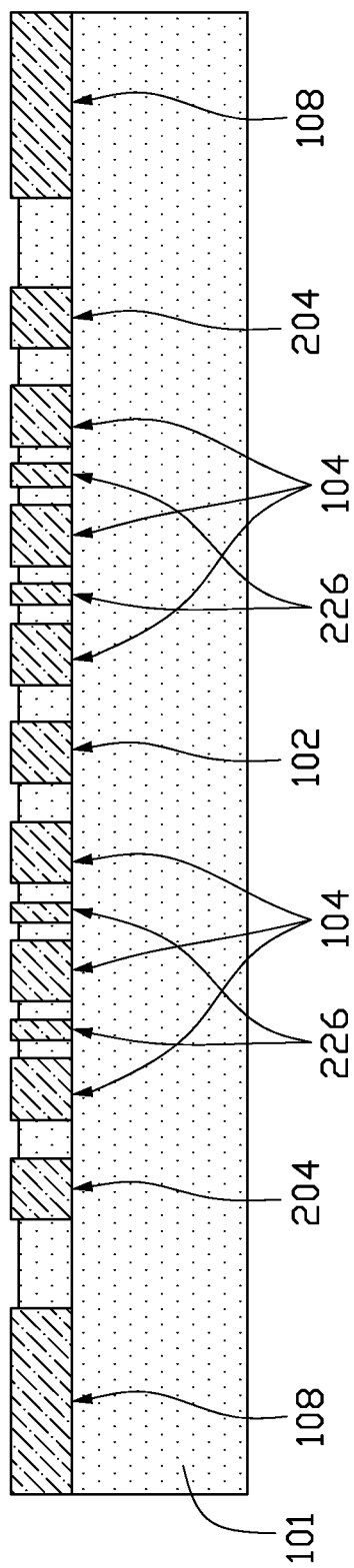

FIG. 3B shows the results after gap-fill with additional dielectric material (e.g. with silicon-dioxide) and CMP (chemical mechanical polishing) of the dielectric material. Typically the surface of the dielectric sits below the surface of the metal electrodes 102, 104, 226, 204, 108. The top surfaces of all these metal electrodes are all at the same height.

Figure 3C:
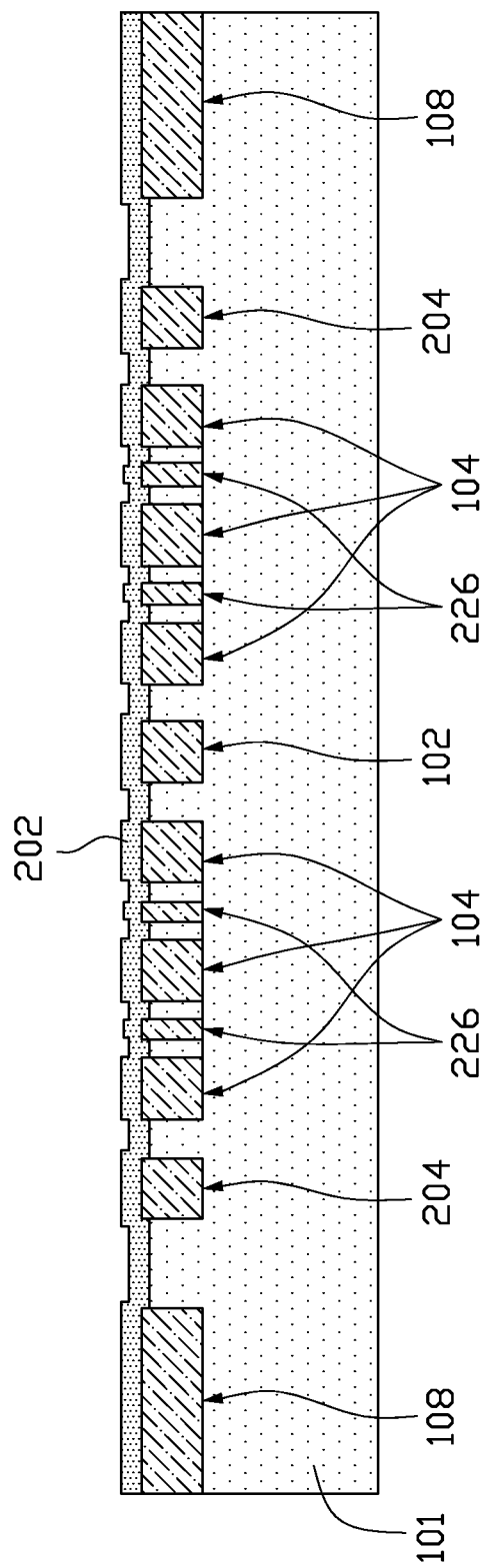

As shown in FIG. 3C the substrate is subsequently covered with an additional dielectric layer 202 which will protect the pull-down electrodes. Typical thicknesses for layer dielectric layer 202 are 50 to 150 nm to limit the electric fields in this dielectric layer.

Figure 3D:
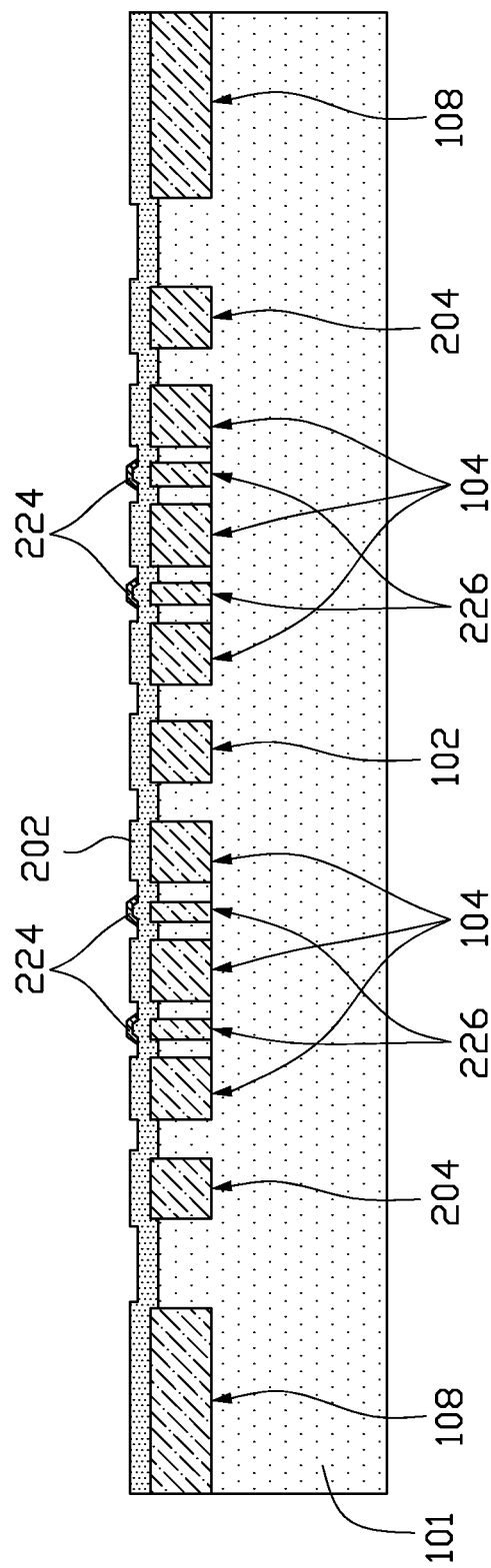

In FIG. 3D an additional layer is deposited and patterned which will provide the additional mechanical stopper 224. These stoppers 224 are oversized with respect to the isolated islands 226. Because the metal surface is higher than the dielectric surface the final area that will be in contact with the landed MEMS bridge is determined by the size of the isolated islands 226. The choice of material for stoppers 224 is such that it can be etched with a good selectivity with respect to the underlying dielectric layer 202. For instance it could consist of a metal like Titanium, Titanium-nitride, or a dielectric like silicon-nitride and silicon-oxynitride. Typical thicknesses for stoppers 224 are 20 to 50 nm.

Figure 3E:
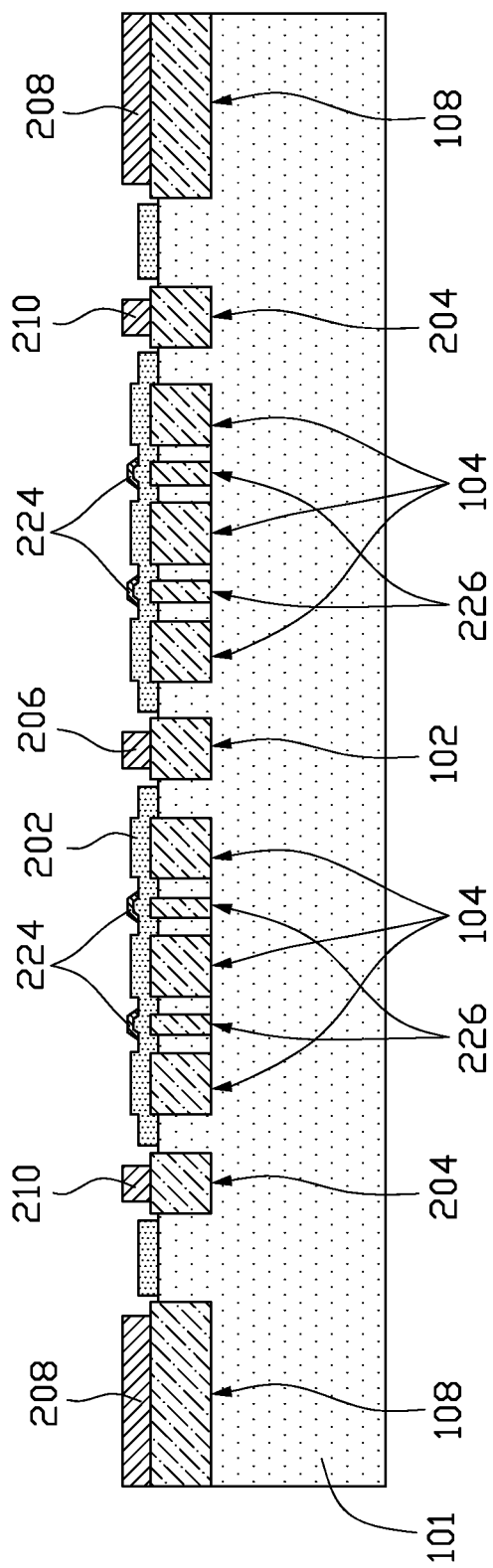

In FIG. 3E the RF contact 206, plate-contacts 210 and anchor contacts 208 are generated by opening a via in the dielectric layer 202 and depositing a the contact material which is subsequently patterned to form contacts 206, 208, 210. Typical materials used for the contacting layers 210, 206, 208 include Ti, TiN, TiAl, TiAlN, AlN, Al, W, Pt, Ir, Rh, Ru, RuO$_2$, ITO and Mo and combinations thereof. The thickness of this layer is typically such that it protrudes above the stoppers 224 by 20 to 80 nm, depending on what contact force needs to be generated.

Figure 3F:
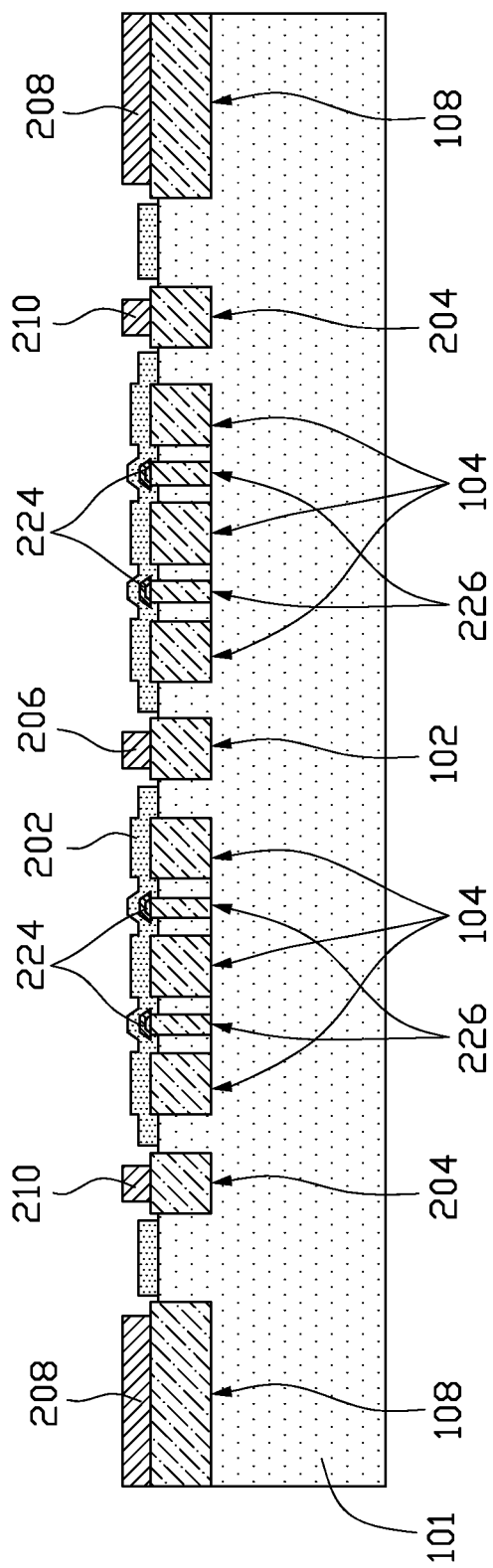

FIG. 3F shows an alternative embodiment where the stoppers 224 is embedded inside the dielectric layer 202. With this alternative embodiment MEMS bridge touches the dielectric layer 202 above these stoppers 224 instead of touching the stoppers 224 themselves. This is embedded contact layer is generated by an additional deposition of a dielectric layer 202 on top of the surface after patterning the contact stoppers 224 in FIG. 3D. To end up with the same total dielectric layer 202 thickness over the pull-down electrode 104, the thicknesses of the first and second part of the dielectric depositions before and after patterning stoppers 224 can be reduced.

Figure 3G:
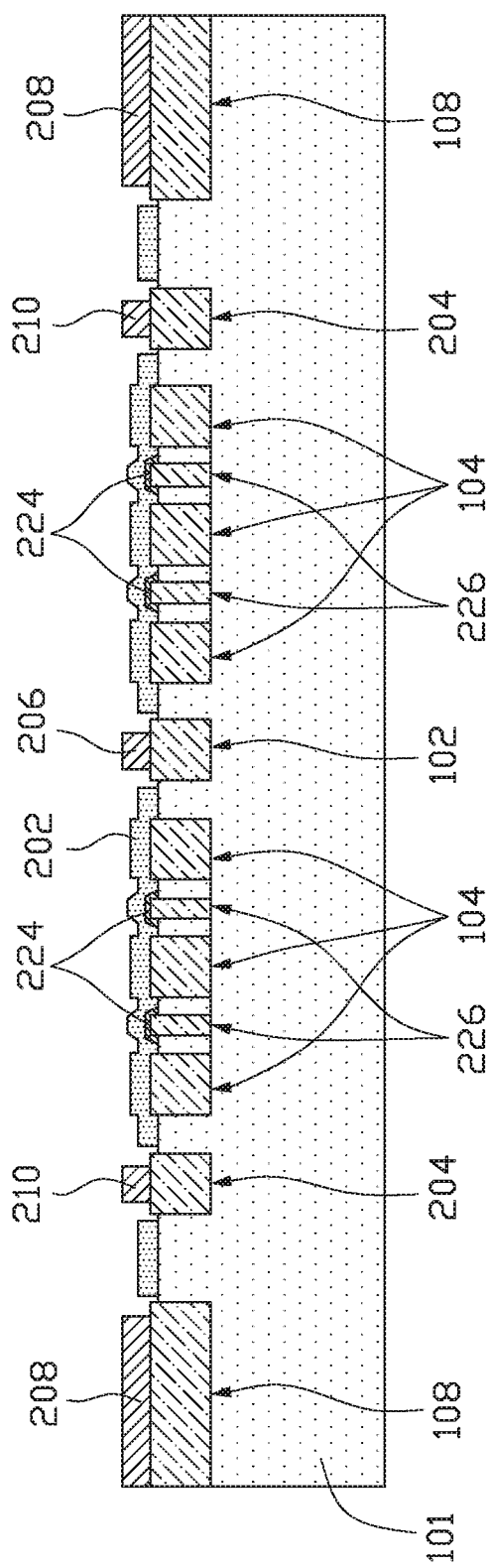

FIG. 3G shows yet another alternative embodiment where the contact layer is patterned to form the stoppers 224 directly on top of the metal islands 226 and is subsequently covered with the dielectric layer 202.

All three embodiments of FIGS. 3E, 3F and 3G give good control of the contact heights as all are relative to the top-surface of the metal electrodes 102, 104, 106 which are at the same height. The contact heights are set by the deposition thicknesses of layers used to form dielectric layer 202, stoppers 224 and electrodes 206, 208, 210 which can be tightly controlled in the process.

By utilizing islands within the pull-down electrode and a different height for a secondary landing location, the contact resistance of MEMS switches can be controlled over a wide voltage operating range.

While the foregoing is directed to embodiments of the present disclosure, other and further embodiments of the disclosure may be devised without departing from the basic scope thereof, and the scope thereof is determined by the claims that follow.

The invention claimed is:

1. A MEMS device, comprising:
    a substrate having at least an anchor electrode, an RF electrode and a pull-down electrode disposed therein, wherein the pull-down electrode has a plurality of islands disposed therein;
    a switching element disposed over the substrate, the switching element electrically coupled to the anchor electrode and movable from a first position spaced a first distance from the RF electrode and a second position spaced a second distance from the RF electrode, wherein the second distance is less than the first distance;
    a dielectric layer disposed over the pull-down electrode; and
    contact stoppers disposed on the dielectric layer at locations corresponding to the islands.

2. The MEMS device of claim 1, further comprising:
    an anchor contact disposed on the anchor electrode and extending to a first height above the substrate; and
    an RF stopper disposed on the RF electrode and extending to the first height above the substrate.

3. The MEMS device of claim 2, wherein the contact stoppers and dielectric layer collectively extend to a second height above the substrate, wherein the second height is less than the first height.

4. The MEMS device of claim 3, wherein the islands are electrically isolated from the pull-down electrode.

5. The MEMS device of claim 4, further comprising a plate landing electrode disposed in the substrate between the anchor electrode and the pull-down electrode.

6. The MEMS device of claim 5, further comprising a plate landing contact disposed on the plate landing electrode.

7. The MEMS device of claim 6, wherein the plate landing contact extends above the substrate by the first height.

8. A MEMS device, comprising:
    a substrate having at least an anchor electrode, an RF electrode and a pull-down electrode disposed therein, wherein the pull-down electrode has a plurality of islands disposed therein;
    a switching element disposed over the substrate, the switching element electrically coupled to the anchor electrode and movable from a first position spaced a first distance from the RF electrode and a second position spaced a second distance from the RF electrode, wherein the second distance is less than the first distance;
    contact stoppers disposed on the islands; and
    a dielectric layer disposed over the substrate, contact stoppers and pull-down electrode.

9. The MEMS device of claim 8, further comprising:
    an anchor contact disposed on the anchor electrode and extending to a first height above the substrate; and
    an RF stopper disposed on the RF electrode and extending to the first height above the substrate.

10. The MEMS device of claim 9, wherein the contact stoppers and dielectric layer collectively extend to a second height above the substrate, wherein the second height is less than the first height.

11. The MEMS device of claim 10, wherein the islands are electrically isolated from the pull-down electrode.

12. The MEMS device of claim 11, further comprising a plate landing electrode disposed in the substrate between the anchor electrode and the pull-down electrode.

13. The MEMS device of claim 12, further comprising a plate landing contact disposed on the plate landing electrode.

14. The MEMS device of claim 13, wherein the plate landing contact extends above the substrate by the first height.

15. A MEMS device, comprising:
- a substrate having at least an anchor electrode, an RF electrode and a pull-down electrode disposed therein, wherein the pull-down electrode has a plurality of islands disposed therein;
- a switching element disposed over the substrate, the switching element electrically coupled to the anchor electrode and movable from a first position spaced a first distance from the RF electrode and a second position spaced a second distance from the RF electrode, wherein the second distance is less than the first distance;
- a dielectric layer disposed over the pull-down electrode; and
- contact stoppers disposed within the dielectric layer at locations corresponding to the islands.

16. The MEMS device of claim 15, further comprising:
- an anchor contact disposed on the anchor electrode and extending to a first height above the substrate; and
- an RF stopper disposed on the RF electrode and extending to the first height above the substrate.

17. The MEMS device of claim 16, wherein the contact stoppers and dielectric layer collectively extend to a second height above the substrate, wherein the second height is less than the first height.

18. The MEMS device of claim 17, wherein the islands are electrically isolated from the pull-down electrode.

19. The MEMS device of claim 18, further comprising a plate landing electrode disposed in the substrate between the anchor electrode and the pull-down electrode.

20. The MEMS device of claim 19, further comprising a plate landing contact disposed on the plate landing electrode.

21. The MEMS device of claim 20, wherein the plate landing contact extends above the substrate by the first height.

\* \* \* \* \*